United States Patent
Hirler et al.

(10) Patent No.: US 9,960,156 B2
(45) Date of Patent: May 1, 2018

(54) INTEGRATED SEMICONDUCTOR DEVICE HAVING A LEVEL SHIFTER

(71) Applicant: Infineon Technologies AG, Neubiberg (DE)

(72) Inventors: Franz Hirler, Isen (DE); Andreas Meiser, Sauerlach (DE); Steffen Thiele, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days. days.

(21) Appl. No.: 14/795,207

(22) Filed: Jul. 9, 2015

(65) Prior Publication Data

US 2015/0311196 A1   Oct. 29, 2015

Related U.S. Application Data

(62) Division of application No. 13/548,266, filed on Jul. 13, 2012, now Pat. No. 9,111,764.

(51) Int. Cl.
*H01L 29/76* (2006.01)
*H01L 29/94* (2006.01)
(Continued)

(52) U.S. Cl.
CPC ........ *H01L 27/0623* (2013.01); *H01L 23/481* (2013.01); *H01L 23/528* (2013.01); *H01L 27/088* (2013.01); *H01L 27/0826* (2013.01); *H01L 29/1095* (2013.01); *H01L 29/42372* (2013.01); *H01L 29/7395* (2013.01); *H01L 29/7802* (2013.01); *H03K 17/687* (2013.01); *H03K 19/018507* (2013.01); *H01L 29/0634* (2013.01); *H01L 29/402* (2013.01); *H01L 29/735* (2013.01); *H01L 29/7327* (2013.01); *H01L 29/781* (2013.01);
(Continued)

(58) Field of Classification Search
CPC .................. H01L 27/06; H01L 21/336; H01L 21/823487; H01L 27/0694; H01L 27/1207
USPC .................. 257/299–342, 288, 20, E27.004; 327/112, 534, 536
See application file for complete search history.

(56) References Cited

U.S. PATENT DOCUMENTS

| | | |
|---|---|---|
| 5,929,656 A | 7/1999 | Pagones |
| 6,323,704 B1 | 11/2001 | Pelley et al. |

(Continued)

FOREIGN PATENT DOCUMENTS

| | | |
|---|---|---|
| CN | 101183650 A | 5/2008 |
| CN | 101242133 A | 8/2008 |
| CN | 102376680 A | 3/2012 |

*Primary Examiner* — Kimberly Rizkallah
*Assistant Examiner* — Brian Turner
(74) *Attorney, Agent, or Firm* — Murphy, Bilak & Homiller, PLLC

(57) ABSTRACT

An integrated semiconductor device is provided. According to an embodiment, the integrated semiconductor device includes a semiconductor body having a first surface with a normal direction defining a vertical direction, an opposite surface, a first area including a vertical power field-effect transistor structure, a second area including a three-terminal step-down level-shifter, and a third area including a three-terminal step-up level-shifter. A terminal of the vertical power field-effect transistor structure is electrically connected with one of the three-terminal step-down level-shifter and the three-terminal step-up level-shifter.

14 Claims, 12 Drawing Sheets

(51) Int. Cl.

| | | |
|---|---|---|
| *H01L 31/062* | (2012.01) | |
| *H01L 31/113* | (2006.01) | |
| *H01L 31/119* | (2006.01) | |
| *H01L 27/088* | (2006.01) | |
| *H01L 21/336* | (2006.01) | |
| *H01L 21/70* | (2006.01) | |
| *H01L 27/06* | (2006.01) | |
| *H01L 27/082* | (2006.01) | |
| *H01L 29/423* | (2006.01) | |
| *H01L 23/48* | (2006.01) | |
| *H01L 23/528* | (2006.01) | |
| *H01L 29/10* | (2006.01) | |
| *H01L 29/739* | (2006.01) | |
| *H03K 17/687* | (2006.01) | |
| *H03K 19/0185* | (2006.01) | |
| *H01L 29/40* | (2006.01) | |
| *H01L 29/732* | (2006.01) | |
| *H01L 29/735* | (2006.01) | |
| *H01L 29/78* | (2006.01) | |
| *H01L 29/06* | (2006.01) | |

(52) U.S. Cl.
CPC ....... *H01L 29/7811* (2013.01); *H01L 29/7813* (2013.01); *H01L 29/7824* (2013.01); *H01L 2924/0002* (2013.01); *H03K 2217/0063* (2013.01); *H03K 2217/0072* (2013.01); *H03K 2217/0081* (2013.01)

(56) References Cited

U.S. PATENT DOCUMENTS

| | | | |
|---|---|---|---|
| 6,586,974 B1 | 7/2003 | Humphrey et al. | |
| 6,903,588 B2 | 6/2005 | Vorenkamp | |
| 6,979,850 B2 | 12/2005 | Hatade | |
| 7,233,178 B2 | 6/2007 | Yu et al. | |
| 7,233,718 B2 | 6/2007 | Hwang et al. | |
| 7,910,992 B2 | 3/2011 | Ashrafzadeh | |
| 8,390,341 B2 | 3/2013 | Sugie | |
| 8,546,875 B1 | 10/2013 | Hirler et al. | |
| 8,648,630 B2 | 2/2014 | Yang et al. | |
| 8,692,577 B2 | 4/2014 | Takayama et al. | |
| 2005/0077608 A1* | 4/2005 | Kagaya | H01L 23/3128 257/686 |
| 2006/0006432 A1* | 1/2006 | Shiraishi | H01L 21/823487 257/288 |
| 2006/0087343 A1 | 4/2006 | Himi et al. | |
| 2006/0118852 A1* | 6/2006 | Rueb | H01L 27/1087 257/301 |
| 2007/0080708 A1 | 4/2007 | Chellamuthu et al. | |
| 2008/0252372 A1 | 10/2008 | Williams | |
| 2009/0045497 A1* | 2/2009 | Kagaya | H01L 23/3128 257/686 |
| 2009/0085117 A1* | 4/2009 | Harada | H01L 27/0222 257/360 |
| 2009/0224313 A1* | 9/2009 | Burke | H01L 24/05 257/330 |
| 2012/0256250 A1* | 10/2012 | Schulze | H01L 21/823487 257/328 |
| 2013/0087896 A1* | 4/2013 | Chou | H01L 23/36 257/659 |
| 2016/0111403 A1* | 4/2016 | Yap | H01L 25/165 257/676 |

\* cited by examiner

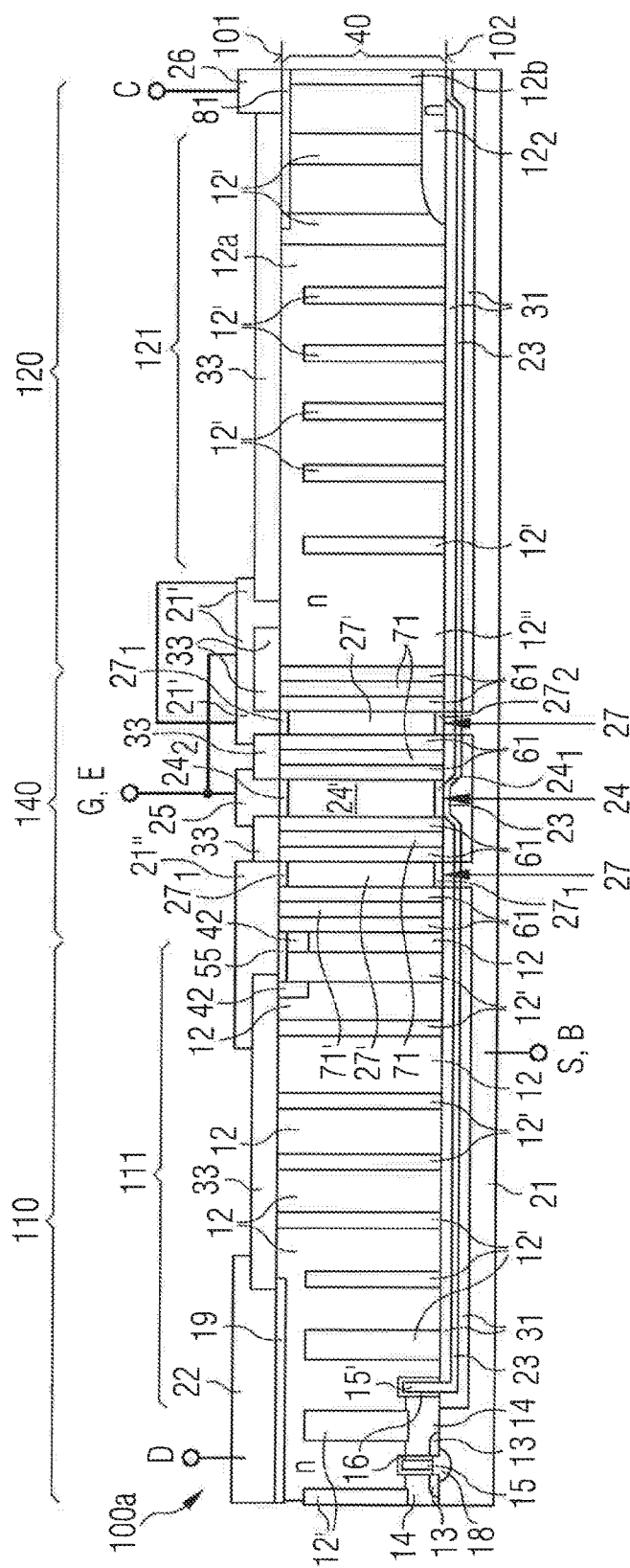

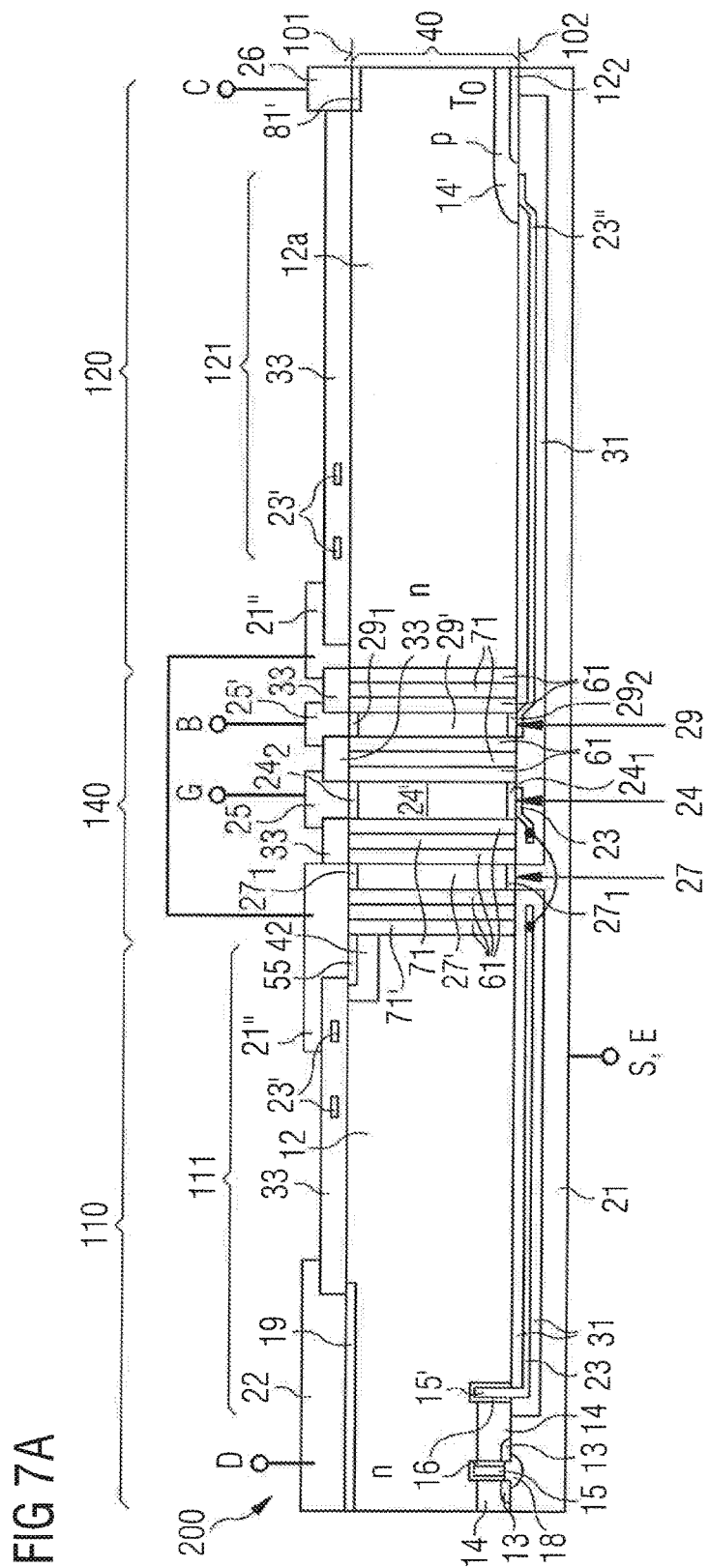

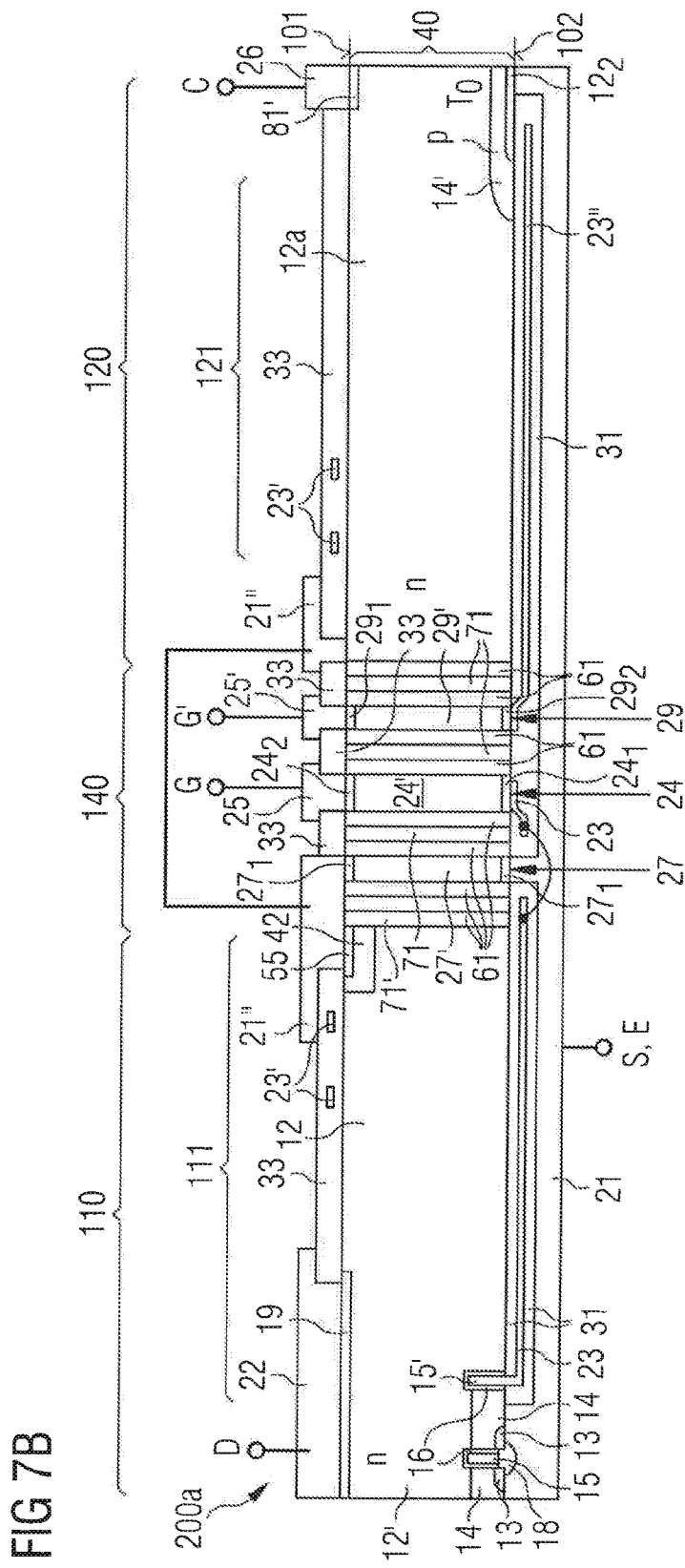

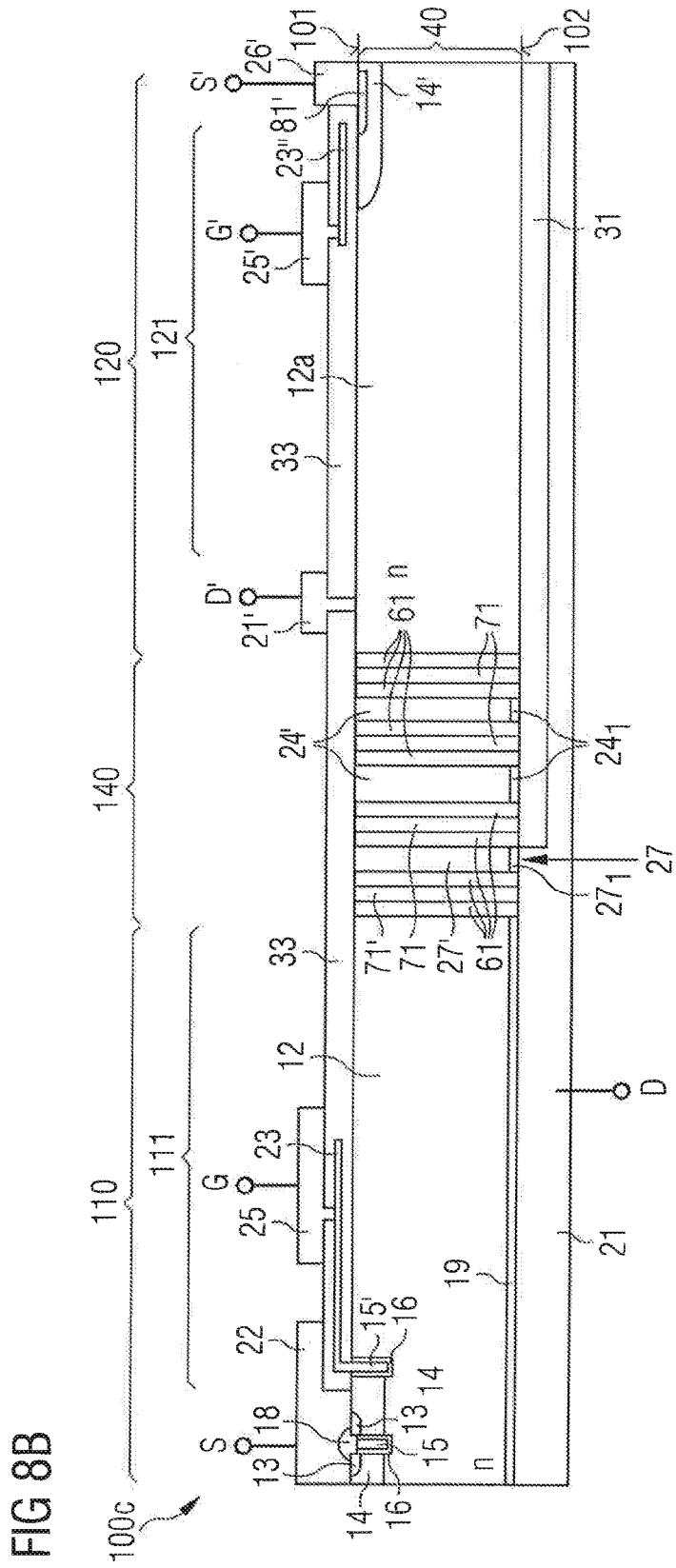

US 9,960,156 B2

INTEGRATED SEMICONDUCTOR DEVICE HAVING A LEVEL SHIFTER

TECHNICAL FIELD

Embodiments of the present invention relates to integrated semiconductor devices, in particular to integrated semiconductor devices having a vertical power field-effect structure, and to a bridge circuit, in particular to a bridge circuit having a high-side switch, a low-side switch and at least one level-shifter.

BACKGROUND

Semiconductor transistors, in particular field-effect controlled switching devices such as a Metal Oxide Semiconductor Field Effect Transistor (MOSFET) or an Insulated Gate Bipolar Transistor (IGBT) have been used for various applications including but not limited to use as power switches in power supplies and power converters, electric cars, air-conditioners, and even stereo systems. For example, power MOSFETS are used as low-side and high-side power switches in bridge circuits to drive an electric motor. Typically, the switching states of the power switches are monitored in such a bridge circuit to properly synchronize them. This is to avoid, for example, that the low-side switch is switched on prior to switching off the high-side switch. This typically requires that the driver of the low-side switch is connected to the high-side switch to evaluate the switching state of the high-side switch. Likewise, the driver of the high-side switch is typically connected to the low-side switch to evaluate the switching state of the low-side switch in the bridge circuit.

Due to the different voltage levels of the low-side switch and the high-side switch, two level-shifter are typically used in bridge circuits, for example a step-up level-shifter between the low-side switch and the driver of the high-side switch and a step-down level-shifter between the high-side switch and the driver of the low-side switch. Accordingly, the voltage difference between the low-side arm and the high-side arm of the bridge circuit is mainly taken by the level-shifter so that a rated breakdown voltage of the driver circuitry for the high-side switch and the low-side switch, respectively, may only be given by the gate voltage, which may be about 1 V to about 20 V for n-channel MOSFETs. Typically, the level-shifters are integrated into respective driver-ICs (integrated circuits), for example a common MOSFET driver stage circuit. For power applications, in particular for voltages of about 400 V or even more than about 600 V, the driver ICs of the bridge circuits are however expensive due the required high voltage blocking capability.

Accordingly, there is a need to improve bridge circuits for power applications.

SUMMARY

According to an embodiment of a bridge circuit, the bridge circuit includes a first integrated semiconductor device having a high-side switch, a second integrated semiconductor device having a low-side switch electrically connected with the high-side switch, a first level-shifter electrically connected with the high-side switch and integrated in one of the first integrated semiconductor device and the second integrated semiconductor device, and a second level-shifter electrically connected with the low-side switch and integrated in one of the first integrated semiconductor device and the second integrated semiconductor device.

According to an embodiment of an integrated semiconductor device, the integrated semiconductor device includes a semiconductor body which includes a first surface having a normal direction defining a vertical direction, an opposite surface, a first area including a vertical power field-effect transistor structure, a second area including a three-terminal step-down level-shifter, and a third area including a three-terminal step-up level-shifter. A terminal of the vertical power field-effect transistor structure is electrically connected with one of the three-terminal step-down level-shifter and the three-terminal step-up level-shifter.

According to an embodiment of an integrated semiconductor device, the integrated semiconductor device includes a semiconductor body having a first surface with a normal direction defining a vertical direction and an opposite surface. When seen from above the integrated semiconductor device further includes a first area including a second metallization arranged on the first surface and forming a second load terminal, at least one second area including a level shifter having at least one metallization arranged on the first surface, and a through contact area. In a vertical cross-section the integrated semiconductor device further includes a common metallization arranged on the opposite surface in the first area, the at least one second area and the through contact area and forms a first load terminal, a first dielectric region extending between the first surface and the opposite surface, a second dielectric region extending between the first surface and the opposite surface, a conductive structure, which is electrically connected with the first terminal, extends to the first surface and is arranged in the through contact area and between the first dielectric region and the second dielectric region, a gate terminal arranged on the first surface, and a gate electrode for controlling a load current between the first load terminal and the second load terminal. The gate electrode is arranged in the first area and electrically connected with a gate terminal.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 6B illustrates another vertical cross-section through the integrated semiconductor device of FIG. 6A according to an embodiment;

FIG. 7A illustrates a vertical cross-section through an integrated semiconductor device according to an embodiment;

FIG. 7B illustrates a vertical cross-section through an integrated semiconductor device according to another embodiment;

FIG. 8B illustrates a vertical cross-section through an integrated semiconductor device according to yet another embodiment.

DETAILED DESCRIPTION

Figure 1:
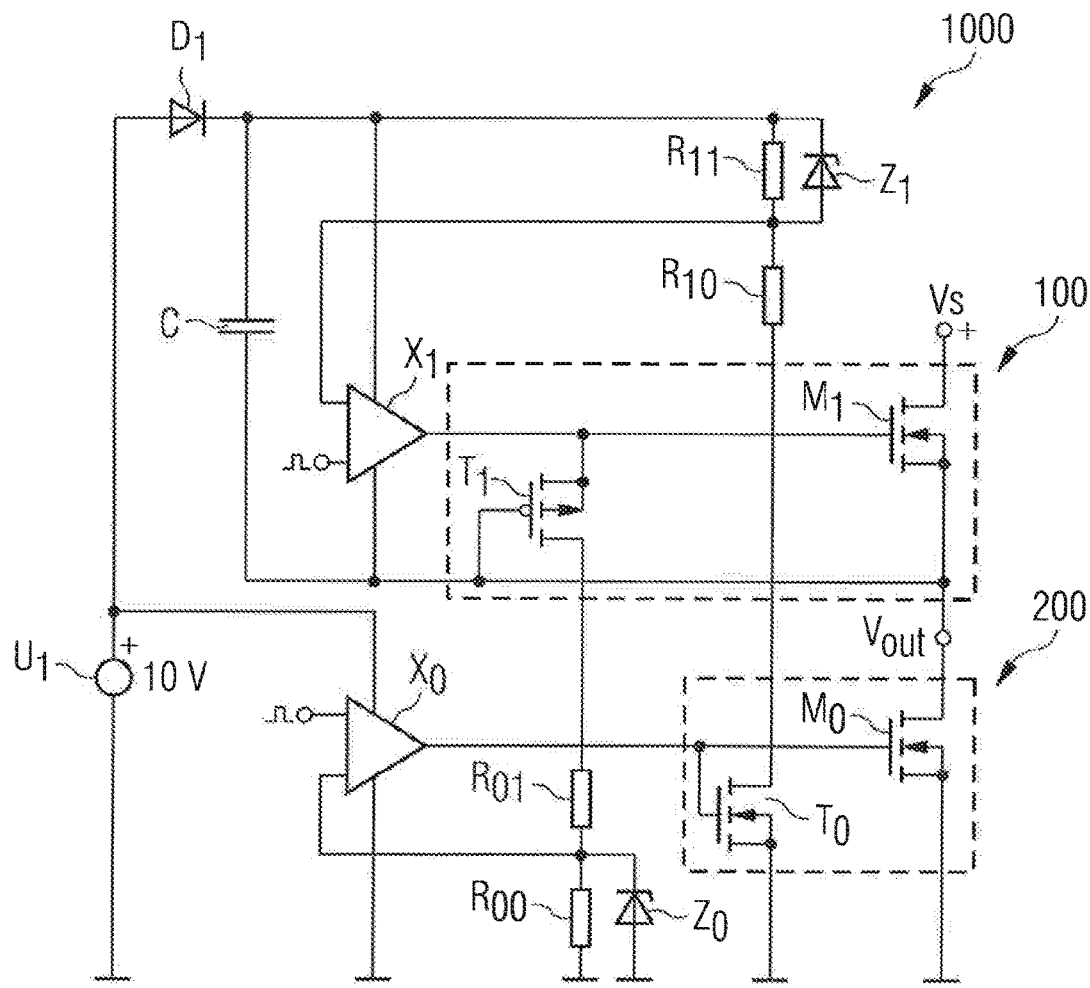
FIG. 1 illustrates a circuit diagram of a bridge circuit according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to integrated semiconductor devices, in integrated particular to integrated semiconductor devices having a power field-effect semiconductor transistor and at least one level-shifter, and to bridge circuits having at least one integrated semiconductor device.

The term "level-shifter" as used in this specification intends to describe a semiconductor circuitry that converts one dc voltage level to another dc voltage level, typically by a factor of at least about five or ten. The level shifter typically includes a transistor, for example a MOSFET or a bipolar transistor, with a control electrode, for example a gate electrode. A change of the voltage applied to the control electrode typically results in changing the current through the transistor and a voltage of a voltage divider, formed for example by a series connection of two resistors, connected with the transistor. The term that "a level-shifter is integrated in a semiconductor device" intends to describe that at least the active electronic components of the level-shifter, for example the transistor, are integrated into the semiconductor device.

The integrated semiconductor device typically includes in a first area a vertical power semiconductor transistor, typically a power field-effect transistor such as a vertical power IGBT or a vertical power MOSFET with a source metallization arranged on the first surface and an insulated gate electrode arranged next to the first surface, for example on the first surface, and a drain metallization arranged on a second surface arranged opposite to the first surface. When a gate metallization is arranged on the first surface, the arrangement of metallizations and terminals, respectively, is also referred to as drain-down configuration. Alternatively, the gate metallization and the drain metallization are arranged on the first surface and the source metallization and the insulated gate electrode are arranged on the second surface in a so-called source-down configuration. The metallizations typically also provide respective terminals, for example in pad regions. The vertical power semiconductor transistor typically includes in an active area a plurality of cells, for example IGBT-cells or MOSFET-cells, for carrying and/or controlling a load current. Furthermore, at least one edge-termination structure may at least partially surround the active area when seen from above.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu and Co but may also be made of a material with metallic or near metallic properties with respect to electric conductivity such as highly doped n-type or p-type poly-Si, TiN or an electrically conductive silicide such as $TaSi_2$, $TiSi_2$, PtSi, $CoSi_2$, $WSi_2$ or the like. The metallization may also include different electrically conductive materials, for example a stack of those materials.

The term "edge-termination structure" as used in this specification intends to describe a structure that provides a transition region in which the high electric fields around an active area of the semiconductor device change gradually to the potential at the edge of the device and/or to a reference potential such as ground. Thus, an edge termination structure may also be arranged between to different semiconductor structures integrated into the same semiconductor device and operating different voltages. The edge-termination structure may, for example, lower the field intensity around the termination region of the rectifying junction by spreading the electric field lines across the termination region.

The term "power semiconductor device" as used in this specification intends to describe a semiconductor device on a single chip with high voltage and/or high current switching capabilities. In other words, power semiconductor devices are intended for high current, typically in the Ampere range and/or high voltages of more than about 10 V or even more than about 500 V. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region or emitter region of the first conductivity type and a drift region of the first conductivity type. The drift region may be in contact with a drain region and a collector region, respectively. The drift region may include doped compensation zones of the first conductivity type and doped compensation zones of the second conductivity type in such a way that, in an off-state, their charges can be mutually depleted. The drain region or the collector region is in low resistive electric contact with a drain or collector electrode. The source region or emitter region is in low resistive electric contact with a source or emitter electrode. In the context of the present specification, the term "in low resistive electric contact" intends to describe that there is a low-ohmic ohmic current path between respective elements or portions of a semiconductor device when no voltages are applied to and/or across the semiconductor device. Within this specification the terms "in low resistive electric contact", "electrically connected", and "in low resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "switch" intends to describe a semiconductor structure, typically a power MOSFET or a power IGBT, which is configured to carry a load current, typically in the Ampere range, and to interrupt the load current.

In the context of the present specification, the term "driver circuit" intends to describe a circuit or an electronic component which is configured to control a switch.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region. In other embodiments, the field electrode is not in low resistive electric connection with a terminal and referred to as "floating field plate".

In the context of the present specification, the term "mesa" or "mesa region" intends to describe a semiconductor region between two adjacent trenches extending into the semiconductor substrate or body in a vertical cross-section.

In the context of the present specification, the terms "connected" and "electrically connected", intends to describe that there is an electric connection, typically a resistive electric connection, for example a low-resistive electric connection, or an ohmic current path between two regions, portion or parts of a semiconductor devices through the semiconductor device or between different electrodes, metallizations or terminals of one or more devices of a circuit or between an electrode, a terminal or a metallization and a portion or a part of the semiconductor device.

FIG. 1 illustrates a circuit diagram of a bridge circuit 1000. Bridge circuit 1000 is a half-bridge circuit and includes a first integrated semiconductor device 100 and a second integrated semiconductor device 200 as indicated by the dashed rectangles. The first integrated semiconductor device 100 includes a three-terminal switch $M_1$ having two load terminals and a control terminal. During operation, a first load terminal of the switch $M_1$ is typically fed with a positive voltage $V_s$, for example from a positive terminal of a power supply. Accordingly, switch $M_1$ forms a high-side switch of bridge circuit 1000. The positive voltage $V_s$ may be larger than about 10 V, larger than about 500 V or even larger than about 1000 V.

In the exemplary embodiment, the switch $M_1$ is formed as an n-channel power MOSFET having a drain terminal which is connected to the positive voltage $V_s$.

The second integrated semiconductor device 200 includes a three-terminal switch $M_0$ having two load terminals and a control terminal. A second load terminal of the switch $M_0$ is connected with a source providing a voltage that is lower than the positive voltage $V_s$, for example connected to ground, and a first load terminal of the switch $M_0$ is connected with a second load terminal of the high-side switch $M_1$. Accordingly, switch $M_0$ forms a low-side switch of bridge circuit 1000 which is connected in series with the high-side switch $M_1$.

In the exemplary embodiment, the low-side switch $M_0$ is formed as an n-channel power MOSFET having a source terminal which is connected to ground. The drain terminal of the low-side switch $M_0$ is connected with the source terminal of the high-side switch $M_1$. Accordingly, the low-side switch $M_0$ and the high-side switch $M_1$ are connected in series. One of the drain terminal of the low-side switch $M_0$ and the source terminal of the high-side switch $M_1$ may form an output terminal providing a voltage $V_{out}$ for driving a load, for example an inductive load such as an electromotor, against a second half bridge configuration. Therefore, the drain terminal of the low-side switch $M_0$ and the source terminal of the high-side switch $M_1$ are connected to the output terminal of the bridge circuit 1000.

A first terminal and a second terminal of a first three-terminal level-shifter $T_1$ are electrically connected with the source terminal and the gate terminal of the high-side switch $M_1$, respectively, to monitor the switching states (on, off) of the high-side switch $M_1$. A third terminal of the first level-shifter $T_1$ is electrically connected with a second driver circuit $X_0$ used for driving the gate terminal of the low-level switch $M_0$. Accordingly, the first level-shifter $T_1$ forms a step-down level-shifter. Using the third terminal of the first level-shifter $T_1$ as an input of the second driver circuit $X_0$ allows enabling the low-level switch $M_0$ only when the high-level switch $M_1$ is disabled. In the exemplary embodiment illustrated in FIG. 1, the first level-shifter $T_1$ is formed by a p-channel MOSFET having a source terminal connected to the gate terminal of the high-side switch $M_1$, a gate terminal connected to the source terminal of the high-side switch $M_1$, and a drain terminal connected via a resistor $R_{01}$ to the second driver circuit $X_0$. The resistor $R_{01}$ is typically connected to ground via a further resistor $R_{00}$ and a Zener-diode $Z_0$ switched in parallel.

Likewise, a first terminal and a second terminal of a second three-terminal level-shifter $T_0$ are electrically connected with the source terminal (ground) and the gate terminal of the low-side switch $M_0$, respectively, to monitor the switching states (on, off) of the low-side switch $M_0$. A third terminal of the second level-shifter $T_0$ is electrically connected with a first driver circuit $X_1$ used for driving the gate terminal of the high-level switch $M_1$. Accordingly, the second level-shifter $T_0$ forms a step-up level-shifter. Using the third terminal of the second level-shifter $T_0$ as an input of the first driver circuit $X_1$ allows enabling the high-level switch $M_1$ only when the low-level switch $M_0$ is disabled. In the exemplary embodiment, the second level-shifter $T_0$ is formed by an n-channel MOSFET having a source terminal connected to the source terminal of the low-side switch $M_0$, i.e. to ground in the exemplary embodiment, a gate terminal connected to the gate terminal of the low-side switch $M_0$, and a drain terminal connected via a resistor $R_{10}$ to the first driver circuit $X_1$. The resistor $R_{10}$ is typically connected to a low voltage supply $U_1$ of, for example, 10 V via a further resistor $R_{11}$ and a Zener-diode $Z_1$ switched in parallel. The first and second driver circuits $X_1$, $X_0$ may be implemented as operational amplifiers connected to a μ-controller providing clock signals. Additional electronic devices such as a capacitor C and a Diode $D_1$ may be used to properly dimension bridge circuit 1000.

In the exemplary embodiment illustrated in FIG. 1, the first level-shifter $T_1$ is integrated in the first integrated semiconductor device 100 and the second level-shifter $T_0$ is integrated in the second integrated semiconductor device 200. Accordingly, the first driver circuit $X_1$ and the second driver circuit $X_0$ can be implemented in low power technology. The first and second integrated semiconductor devices 100, 200 are typically manufactured as power semiconductor devices in source-down configuration with high enough blocking capacity. Accordingly, any additional measures for protecting the first and second level-shifters $T_1$, $T_0$ may cost-efficiently be provided in the integrated semiconductor device 100, 200. Thus the overall costs of the of bridge circuit 1000 may be reduced.

Figure 2A:
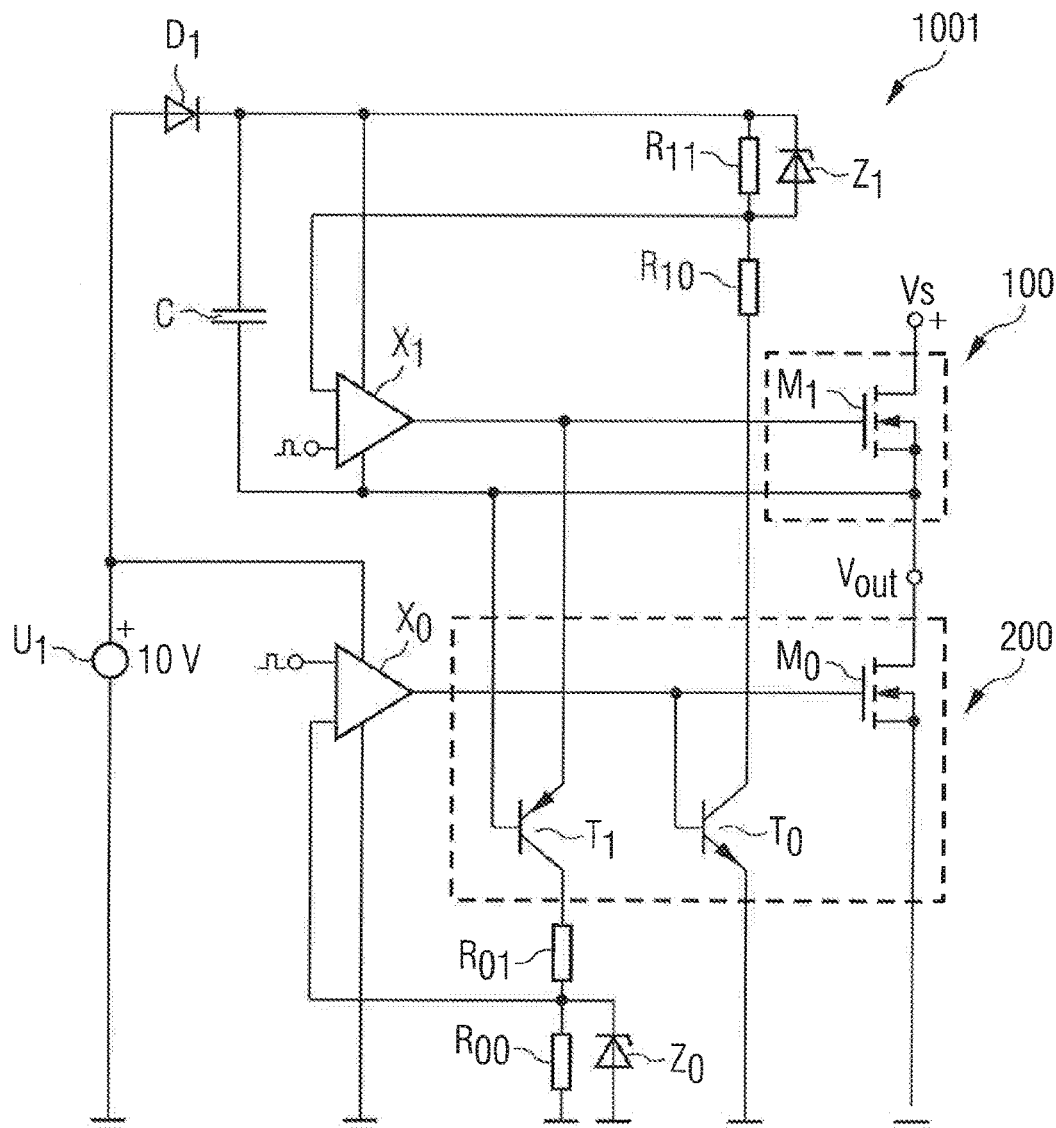
FIG. 2A illustrates a circuit diagram of a bridge circuit according to another embodiment.

FIG. 2A illustrates a circuit diagram of a bridge circuit 1001. Bridge circuit 1001 is similar to the bridge circuit 1000 explained above with regard to FIG. 1. However, the first and second level-shifters $T_1$, $T_0$ are both integrated together with the low-side switch $M_0$ implemented as an n-channel power MOSFET in the second integrated semiconductor device 200. Furthermore, the first and second level-shifters $T_1$, $T_0$ of the bridge circuit 1001 are implemented as a pnp-transistor and an npn-transistor, respectively. Accordingly, the emitter terminal of the first level-shifter $T_1$ is connected with a gate terminal of the high-side switch $M_1$ also implemented as an n-channel power MOSFET, the base terminal of the first level-shifter $T_1$ is connected with the source terminal of the high-side switch $M_1$, and the collector terminal of the first level-shifter $T_1$ is connected with the second driver circuit $X_0$. The base terminal of the second level-shifter $T_0$ is connected with the gate terminal of the low-side switch $M_0$. The emitter terminal of the second level-shifter $T_0$ is connected with the source terminal of the low-side switch $M_0$, i.e. with ground. The collector terminal of the second level-shifter $T_0$ is connected with the first driver circuit $X_1$ driving the gate terminal of the MOSFET integrated into the first semiconductor device 100 as the high-side switch $M_1$ of the bridge circuit 1001.

The first semiconductor device 100 may be an integrated drain-down power semiconductor device, and the second integrated semiconductor device 200 is typically a source-down power semiconductor devices.

Due to integrating the low-side switch $M_0$ and the first and second level-shifters $T_1$, $T_0$ in one integrated semiconductor device 200, the blocking voltage requirements for the drivers and controllers X0, X1 are considerably reduced and the overall cost of the of bridge circuit 1001 may be reduced.

Figure 2B:
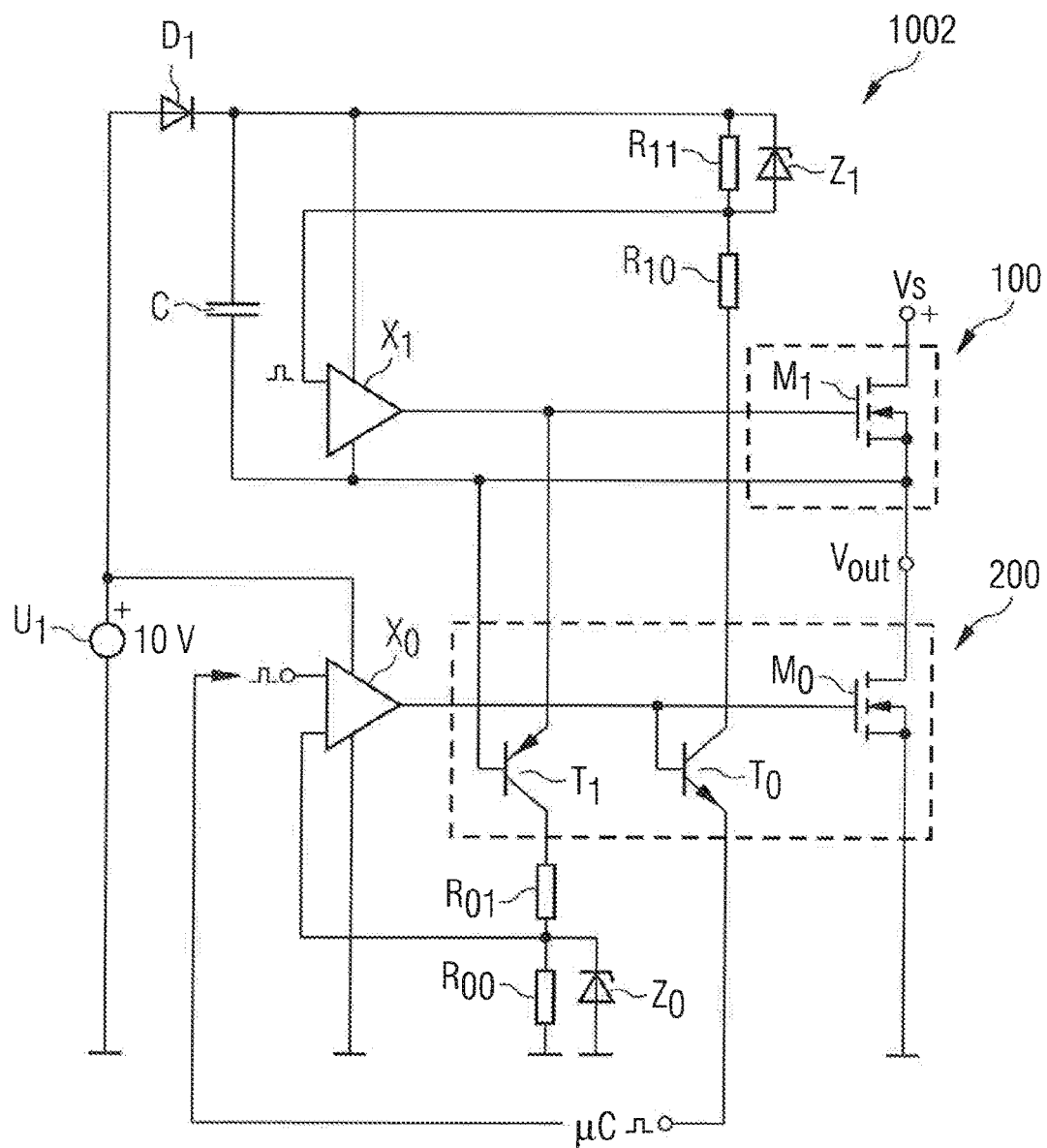
FIG. 2B illustrates a circuit diagram of a bridge circuit according to still another embodiment.

FIG. 2B illustrates a circuit diagram of a bridge circuit 1002. The bridge circuit 1002 is similar to the bridge circuit 1001 explained above with regard to FIG. 2A. However, the emitter terminal of the second level-shifter T0 is not connected with the source terminal of the low-side switch M0, i.e. with ground but to a micro-controller μC which is configured to feed a first clock-signal to the emitter terminal of the second level-shifter T0 and a second clock-signal to the second driver circuit X0. The first clock-signal and the second clock-signal may be the same or time-shifted to compensate dead times and/or delays of the low-side switch M0 and/or the high-side switch M1. This also ensures synchronizing high-side switch M1 and low side switch M0.

According to an embodiment, one or more additional level-shifters are used in respective further second areas 120 of the first integrated semiconductor device 100 and/or the second integrated semiconductor device 200 to transform the voltage level of measured values, corresponding for example to a current, a voltage or a temperature, which are measured in one of the first integrated semiconductor device 100 and the second integrated semiconductor device 200 to the voltage level of the other of the first integrated semiconductor device 100 and second integrated semiconductor device 200. The measured values may be used to improve the switching behavior of the bridge circuit. Note that the additional level shifter(s) may, depending on measurement, not be connected with low-side switch $M_0$ and the high-side switch $M_1$, respectively.

Figure 3:
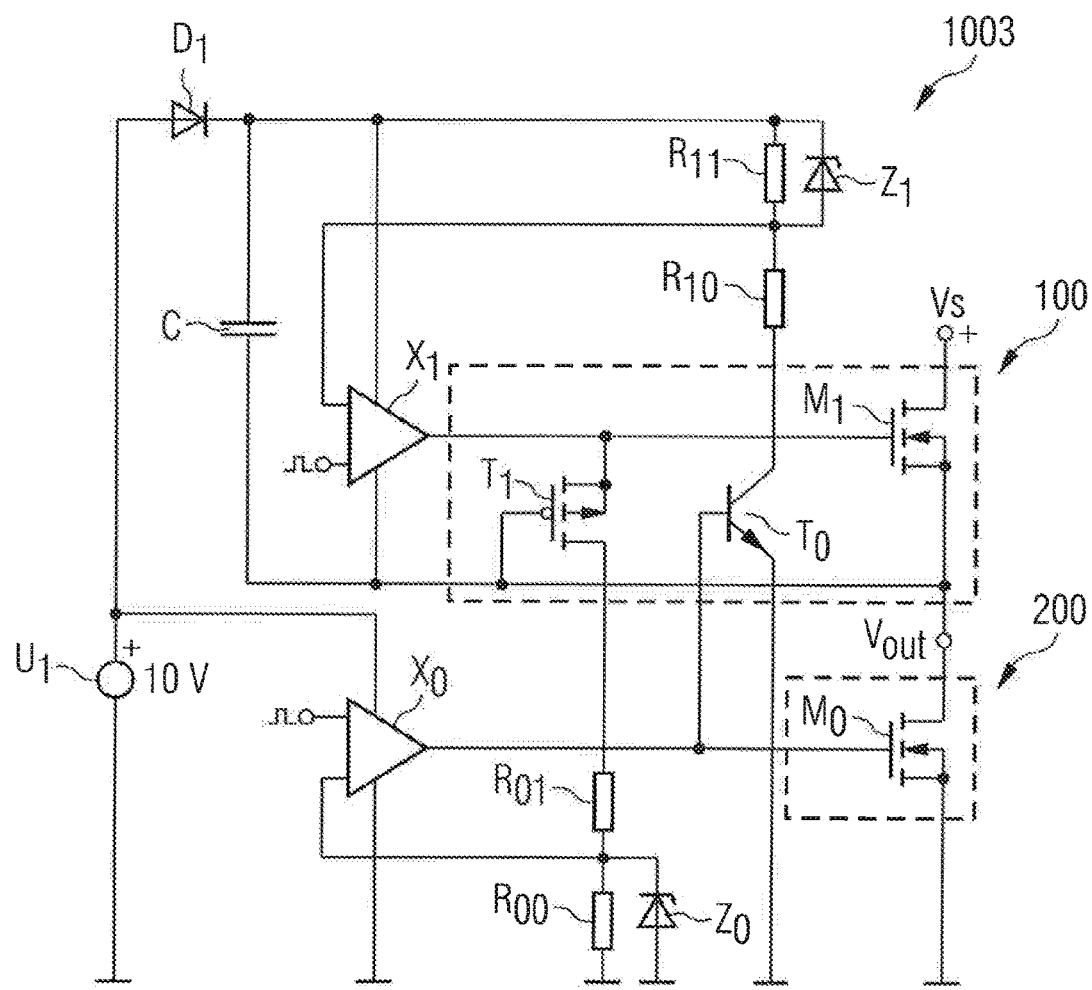
FIG. 3 illustrates a circuit diagram of a bridge circuit according to yet another embodiment.

FIG. 3 illustrates a circuit diagram of a bridge circuit 1003. The bridge circuit 1003 is similar to the bridge circuit 1000 explained above with regard to FIG. 1. However, the first and second level-shifters $T_1$, $T_0$ are integrated together with the high-side switch $M_1$, which is implemented as an n-channel MOSFET, typically in drain-down configuration, in the first integrated semiconductor device 100. Furthermore, the second level-shifter $T_0$ of the bridge circuit 1003 is implemented as an npn-transistor. Accordingly, the base terminal of the second level-shifter $T_0$ is connected with the gate terminal of the low-side switch $M_0$, which is integrated in a second semiconductor device 200, for example in drain-down configuration, the emitter terminal of the second level-shifter $T_0$ is connected with the source terminal of the low-side switch $M_0$, i.e. with ground in the exemplary embodiment, and the collector terminal of the second level-shifter $T_0$ is connected with the first driver circuit $X_1$ driving the gate terminal of the high-side switch $M_1$ of the bridge circuit 1003.

Due to integrating the high-side switch $M_1$ and the first and second level-shifters $T_1$, $T_0$ in one integrated semiconductor device 100, the overall cost of the of bridge circuit 1003 may be reduced.

Figure 4:
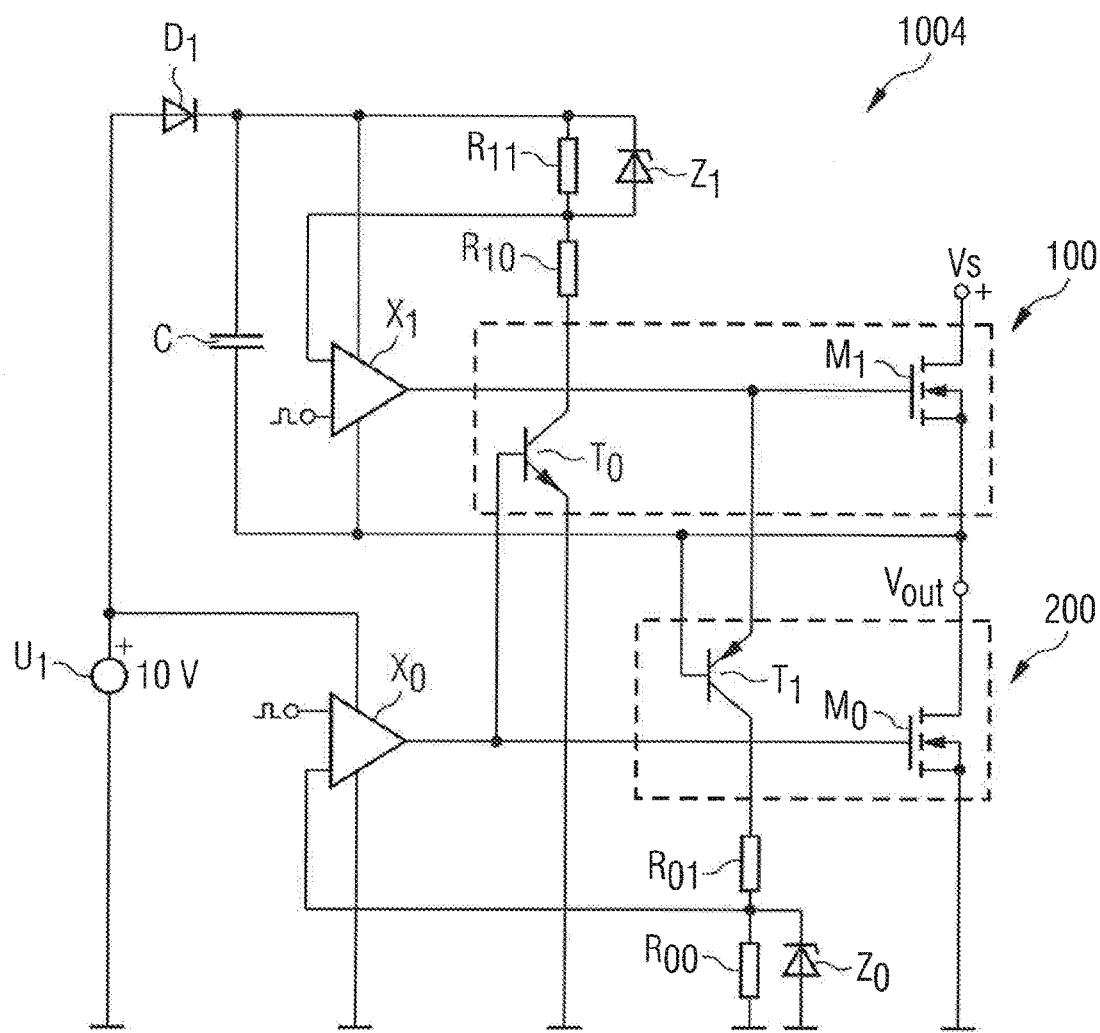
FIG. 4 illustrates a circuit diagram of a bridge circuit according to another embodiment.

FIG. 4 illustrates a circuit diagram of a bridge circuit 1004. Bridge circuit 1004 is similar to the bridge circuit 1000 explained above with regard to FIG. 1. However, the first level-shifter $T_1$ is integrated together with the low-side switch $M_0$, which is implemented as an n-channel MOSFET, typically in drain-down configuration, in the second integrated semiconductor device 200 and the second level-shifter $T_0$ is integrated together with the high-side switch $M_1$, which is also implemented as an n-channel MOSFET, typically in drain-down configuration, in the first integrated semiconductor device 100. Furthermore, the first and second level-shifters $T_1$, $T_0$ of the bridge circuit 1004 are implemented as a pnp-transistor and an npn-transistor, respectively. Accordingly, the base terminal of the second level-shifter $T_0$ is connected with the gate terminal of the low-side switch $M_0$, the emitter terminal of the second level-shifter $T_0$ is connected with the source terminal of the low-side switch $M_0$, i.e. with ground, and the collector terminal of the second level-shifter $T_0$ is connected with the first driver circuit $X_1$ driving the gate terminal of the high-side switch $M_1$. Further, the base terminal of the first level-shifter $T_1$ is connected with the source terminal of the high-side switch $M_1$, the emitter terminal of the first level-shifter $T_1$ is connected with the gate terminal of the high-side switch $M_1$, and the collector terminal of the first level-shifter $T_1$ is connected with the second driver circuit $X_0$ driving the gate terminal of the low-side switch $M_0$.

Due to integrating the high-side switch $M_1$ and the second level-shifter $T_0$ in the integrated semiconductor device 100 and the low-side switch $M_0$ and the first level-shifter $T_1$ in the integrated semiconductor device 200, the overall cost of the of bridge circuit 1004 may be reduced.

Further embodiments of bridge circuits may be obtained by using instead of a p-channel MOSFET a pnp-transistor as a step-down level-shifter or vice versa and/or by using instead of an n-channel MOSFET an npn-transistor as a step-up level-shifter.

For example, instead of using a p-channel MOSFET in the bridge circuits 1000, 1003 explained above with regard to FIG. 1 and FIG. 3, respectively, a pnp-transistor may be used as step-down level-shifter $T_1$. In these embodiments, the base terminal of the pnp-transistor is connected with the source terminal of the respective high-side switch $M_1$, and the emitter terminal of the pnp-transistor is connected with the gate terminal of the respective high-side switch $M_1$, and the collector terminal of the pnp-transistor is connected with the respective second driver $X_0$.

Furthermore, further embodiments of bridge circuits may be obtained by replacing, for example in the circuit illustrated in FIG. 4, one of the low-side switch $M_0$ and the high-side switch $M_1$ by an inductive load, a capacitive load or a resistive load.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown voltage and high critical avalanche field strength, respectively, the doping of the respective semiconductor regions can be chosen higher which reduces the on-state resistance Ron in the following also referred to as on-resistance Ron.

Figure 5:
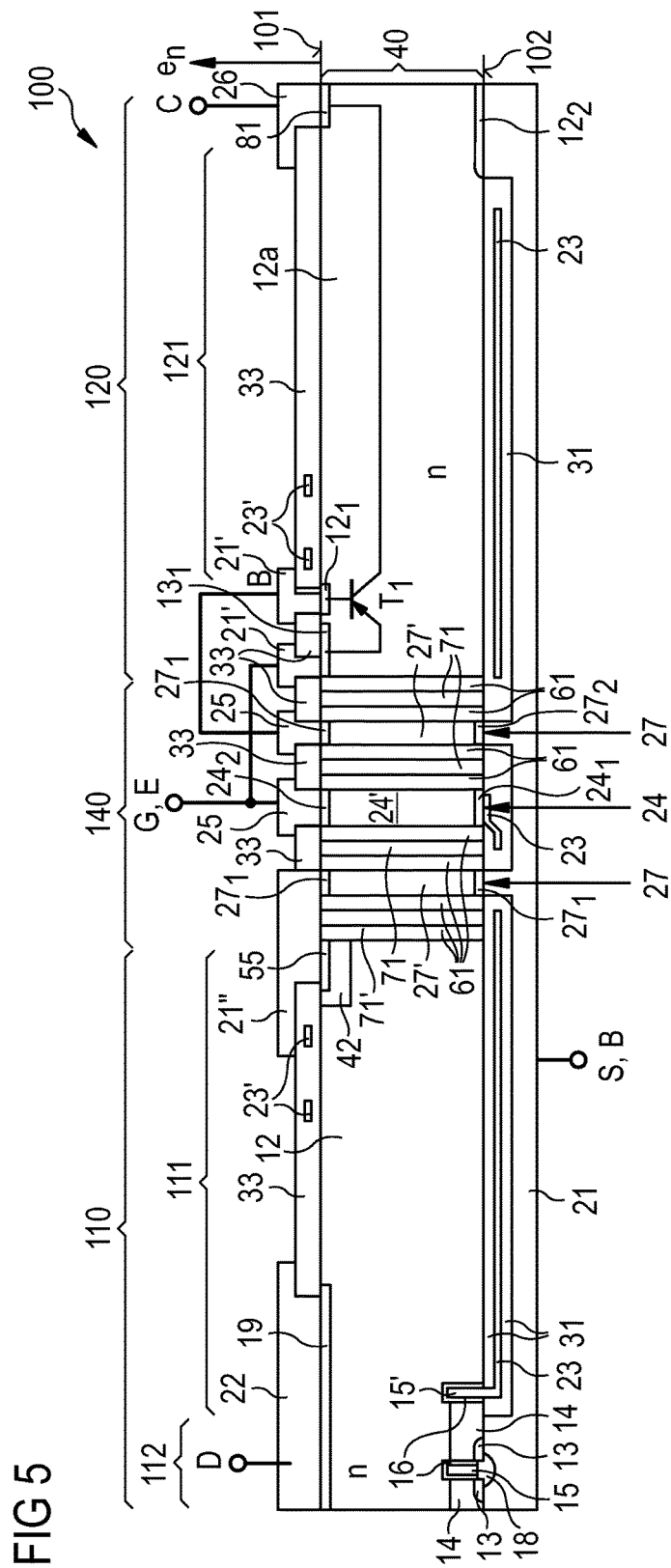
FIG. 5 illustrates a vertical cross-section through an integrated semiconductor device according to an embodiment.

With reference to FIG. 5, a first embodiment of an integrated semiconductor device 100 is explained. FIG. 5 illustrates a vertical cross-section through a semiconductor body 40 of the semiconductor device 100. The semiconductor body 40 extends between a first surface 101 having a normal direction $e_n$ defining a vertical direction and a second surface 102 arranged opposite to the first surface 101. The second surface 102 is also referred to as opposite surface in the following. When seen from above the integrated semiconductor device 100 includes a first area 110, a second area 120 and a through contact area 140. A common metallization 21 is arranged on the opposite surface 102 in the first area 110, the second area 120 and the through contact area 140.

A vertical power MOSFET-structure is formed in the first area 110. In the exemplary embodiment, the vertical power MOSFET-structure is formed as an n-channel MOSFET in a source-down configuration. This means that the common metallization 21 on one side of the semiconductor body 40 forms a source metallization 21, which typically also provides a source terminal S forming a first load terminal of the MOSFET in the exemplary embodiment, whereas a gate metallization 25, which typically also provides a gate terminal G forming a control terminal of the MOSFET, and a drain metallization 22, which typically also provides a drain terminal D forming a second load terminal of the MOSFET, are located on the other side of semiconductor substrate 40, i.e. on the first surface 101 in the exemplary embodiment. Source-down MOSFETs may be soldered or glued with the source metallization 21 to a simple lead frame. Thereby, additional costs for a segmented lead frame may be avoided. Furthermore, source-down MOSFETs may particularly efficiently be cooled through the source metallization 21 which is close to the channel region formed next to the source metallization 21. Further, in applications in which the source metallization is during operation at reference potential, typically at ground, no further insulation of the source-down power MOSFET may be required resulting in better cooling.

In the exemplary embodiment, a semiconductor layer 12 of a first conductivity type (n-type) extends between the first and second surfaces 101, 102 and forms a common drift region of the MOSFET in the first area 110. For sake of clarity, only two transistor cells of an active area 112 of the first area 110 are illustrated in FIG. 5. Typically, active area 112 includes a plurality of transistor cells forming an array.

Each transistor cell includes a body region 14 of a second doping type (p-type) complementary to the first doping type, and a source region 13 of the first doping type arranged next to the second surface 102. The body regions 14 are arranged between the common drift region 12 and the respective source regions 13. The common drift region 12 is located between the body regions 14 and a highly doped n-type common drain region 19 extending to the first surface 101. In an embodiment with a plurality of transistor cells (in FIG. 5 two transistor cells are illustrated) the individual transistor cells share the common drift region 12 and the common drain region 19. Further, the source regions 13 and the body regions 14 of the individual transistor cells are commonly connected to the source metallization 21. Through this, the individual transistor cells are connected in parallel between the source metallization 21 and the drain metallization 22 connected to the common drain region 19. Typically, the body regions 14 of the individual transistor cells are connected to the source metallization 21 via body contact regions (not shown in FIG. 5) of the second doping type that are more highly doped than the body regions 14 and that provide for a low resistance between the source metallization 21 and the body regions 14.

In other embodiments, the semiconductor region 19 shown in FIG. 5 and the FIGS. 6A to 8B explained below is highly p-doped to form a collector region 19 in contact with a collector metallization 22 of an n-channel IGBT-structure. In these embodiments, the common metallization 21 forms an emitter metallization 21 of the IGBT-structure.

Each transistor cell further includes a gate electrode 15 arranged adjacent the respective body region 14 and dielectrically insulated from the body region 14 by a gate dielectric 16. In the embodiment illustrated in FIG. 5, the gate electrode 15 is a trench-electrode that is located in a trench and extends in a vertical direction of the semiconductor body 40 from the source region 13 through the body region 14 into the common drift region 12. The gate electrode 15 is electrically insulated from the source metallization 21 by an insulation layer 18. Transistor cells with a trench electrode are usually referred to as trench transistor cells. Implementing the transistor cells as trench transistor cells, however, is only an example. The individual transistor cells could also be implemented as any other types of conventional transistor cells, such as planar transistor cells (not shown) having the gate electrode on the second surface 102 of the semiconductor body 40.

The transistor cells of FIG. 5 are typically implemented as cells of an enhancement transistor but may in other embodiments be implemented as cells of a depletion transistor. In an enhancement transistor there is a conducting channel in the body region 14 when a gate-source voltage other than zero is applied between the gate and source terminals G, S, while in a depletion transistor the conducting channel already exists at a gate-source voltage of 0 V. The threshold voltage, which is the gate-source voltage at which the conducting channel sets in, can be adjusted through the doping type and doping concentration of the body region 14 along the gate electrode 15 and through (fixed) charges in the gate dielectric 16.

The gate electrodes 15 of the individual transistor cells are electrically connected to a via 24 formed in the through contact area 140. The via 24 is also referred to as second via and gate via in the following. The electrical connection between the gate electrodes 15 and the gate via 24 is typically provided by an internal gate terminal 15' to which the gate electrodes 15 of the individual transistor cells are connected, and by a conductor 23 connected between the internal gate electrode 15' and the via 24. The conductor 23 is electrically insulated from the semiconductor body 40 and the source electrode 21 through an insulation layer 31. The conductor 23 is also referred to as gate conductor in the following.

The internal gate terminal 15' may include the same material as the gate electrodes 15. The gate electrodes 15 can be implemented with a conventional gate electrode material, such as a metal or a highly doped polycrystalline semiconductor material, such as polysilicon. The gate conductor 23 includes, for example, a metal or a highly doped polycrystalline semiconductor material, such as polysilicon.

The gate via 24, which is only schematically illustrated in FIG. 5, can be implemented in many different ways. According to one embodiment the gate via 24 includes a monocrystalline semiconductor material 24', for example a mesa region 24' of the first conductivity type. Optionally, contact regions $24_1$, $24_2$ of the same doping type as the monocrystalline semiconductor material 24' but more highly doped connect the monocrystalline semiconductor material 24' to the gate conductor 23 and the gate terminal 25, respectively. An insulation layer 61, for example a dielectric layer, such as an oxide layer, laterally insulates the gate via 24 from surrounding semiconductor regions and/or further vias 27.

In other embodiments, the gate via 24 includes a core including a metal or a highly doped polycrystalline semiconductor material, such as polysilicon. The core helps to reduce the ohmic resistance of the gate via 24 and may extend from the gate conductor 23 on the second surface 102 to the gate terminal 25 on the first surface 101. According to a further embodiment, the core is distant to the first and/or second surface 101, 102. In still a further embodiment, the gate via 24 is, in the vertical cross-section, surrounded by and/or arranged next to conductive cores 71' connected to the source metallization 21 and/or to floating conductive cores 71. The conductive cores 71' and floating cores 71 typically extend from the second surface 102 to the first surface 101 and are laterally, i.e. in horizontal direction, insulated by respective insulation layers 61. The conductive cores 71' and the floating conductive cores 71 may be used to more evenly distribute the electric field in semiconductor body 40 during operation.

The insulation layer(s) 61 may completely surround the gate via 24 in a horizontal direction. The thickness of this insulation layer(s) 61 may be selected dependent on mechanical stress and the required dielectric strength of the insulation layer(s) 61, where the required dielectric strength is dependent on the maximum voltage difference between the electrical potential of the gate via 24 and the electrical potential regions adjoining the insulation layer(s) 61.

According to an embodiment, the through contact area 140 further includes at least one first conductive via 27 extending in vertical direction through the semiconductor body 40, i.e. between the second surface 102 and the first surface 101, and electrically connected to the source metallization 21 and first load terminal S, respectively. The first conductive vias 27 provide a conductive structure through the semiconductor body 40 that may be implemented similar as explained for the gate via 24. The first conductive vias 27 may be formed of and/or include a metal, a doped polycrystalline or a monocrystalline semiconductor material 27', for example a mesa region 27' of the first conductivity type. Optionally, contact regions $27_1$, $27_2$ of the same doping type as the monocrystalline semiconductor material 27' but more highly doped connect the monocrystalline semiconductor material 27' with the common metallization 21 and a connection metallization 21', which is arranged on the first surface 101 and extends between the first area 110 and the through contact area 140, and a connection metallization 21", respectively, which is arranged on the first surface 101 and extends between the through contact area 140 and a second area 120. Accordingly, the first conductive vias 27 may be used for internal wiring. Furthermore, the gate via 24 may be arranged between two first conductive vias 27 and thus does not contribute to the gate-drain capacitance of the semiconductor device, which is the capacitance between the drain terminal D and the gate terminal G.

The maximum voltage difference between the drain terminal D and the source terminal S is dependent on the voltage blocking capability of the power MOS transistor. This voltage difference can be up to 100V, up to several 100V, for example about 400V, or even up to 1 kV or more. This voltage difference is dependent on a voltage that is applied between the drain and source terminals D, S when the MOS transistor is in operation. This voltage difference reaches its maximum when the transistor is in the off-state (switched off). The maximum voltage difference between the gate terminal G and the source terminal S is, for example, between 10V and 20V. This voltage difference is dependent on the specific type of MOS transistor and is dependent on the electrical potential required at the gate electrode 15 in order to control a conducting channel in the body region 14 between the source region 13 and the common drift region 12. For example, in an n-type enhancement transistor the electrical potential of the gate electrode 15 needs to be higher than the electrical potential at the source terminal S in order to switch the transistor on, while electrical potential of the gate electrode 15 may correspond to the electrical potential at the source terminal S in order to switch the transistor off.

In a sub-area 111 of the first area 110 between the active area 112 and the through contact area 140, the semiconductor device 100 typically includes an edge termination structure that keeps the electrical potential close to the potential in an adjacent portion of the through contact area 140 and/or close to source potential and that is configured to withstand a high voltage difference between the source potential and the electrical potential of the common drain region 19 when the MOSFET is in the off-state. The edge termination structure typically includes a first edge termination region 42 of the second doping type. The first edge termination region 42 is arranged distant to the common drain region 19, adjoins the common drift region 12, is arranged closer to the first surface 101 than to the second surface 102, and is electrically connected to the connection metallization 21" and the source metallization 21, respectively. In the embodiment illustrated in FIG. 5, the first edge termination region 42 adjoins the first surface 101. Optionally, a contact region 55 of the second doping type and more highly doped than the first edge termination region 42 is arranged between the connection metallization 21" and the first edge termination region 42.

Typically, further edge-termination structures such as the illustrated floating field plates 23' may be arranged close to the first surface 101, for example on the first surface 101 and spaced apart from the semiconductor body 40 by an insulating layer 33, and horizontally between the drain metallization 22 and the connection metallization 21". This may improve the blocking voltage of the integrated MOSFET.

In particular for comparatively low blocking voltages, for example for blocking voltages of less than about 50 V, the edge-termination structure may only be arranged next to the second surface 102. In this embodiment, the left conductive via 27 may be saved.

According to an embodiment, a three-terminal step-down level-shifter $T_1$ is integrated in the second area 120 of the integrated semiconductor device 100. In the exemplary embodiment, the step-down level-shifter $T_1$ is implemented as a pnp-transistor having a base region 12a of the first conductivity type, which extends to the first surface 101 and is typically connected to a connection metallization 21' via a first base contact region $12_1$ of the first conductivity type having a higher doing concentration than the base region 12a and/or a second base contact region $12_2$ of the first conductivity type having a higher doing concentration than the base region 12a. An emitter region $13_1$ of the second conductivity type, which is arranged next to the first surface 101, forms a pn-junction with the base region 12a and is connected with the gate metallization 25. A collector region 81 of the second conductivity type, which is arranged next to the first surface 101, forms a pn-junction with the base region 12a and is connected with a collector metallization 26 arranged on the first surface 101. The collector metallization 26 typically also provides a collector terminal C. The gate metallization 25 of the MOSFET may also provide the wiring to the emitter E of the level-shifter $T_1$. Accordingly, semiconductor device 100 may be used in a bridge circuit similar as explained above with regard to FIG. 1 as integrated semiconductor device 100 with a high-side switch and a step-down level-shifter $T_1$.

The MOSFET of the integrated semiconductor device 100 is implemented in a source-down configuration. Typically, the source metallization 21 completely covers the integrated semiconductor device 100 on one side.

Similar as explained for the MOSFET of the first area 110, floating field plates 23' may be provided in a sub-area 121 of the second area 120 next to and/or on the first surface 101 to more evenly distribute the electric field in a blocking mode of the level-shifter $T_1$.

Instead of or in addition to the illustrated edge termination structure with floating field plates 23', other planar edge terminations such as field rings, partially or fully depletable dopings (VLD edges, variation of lateral doping), coverings with insulating, semi-insulating or electroactive layers also in combination may be arranged next to the first surface 101 and or the second surface 102. Furthermore, vertical edge-termination structures, also known as mesa edge-termination structures, such as a circumferential vertical trench filled with an insulating or a semi-insulating material may be used also in combination with planar edge terminations.

In a further or third area, a step-up level-shifter $T_0$ (not shown in FIG. 5) may additionally be integrated. Note that FIG. 5 and the following Figures typically correspond to only a section of a complete cross-section through semiconductor body 40. In this embodiment, the semiconductor device 100 may be used as an integrated semiconductor device 100 with a high-side switch, a step-down level-shifter $T_1$, and a step-up level-shifter $T_0$ in a bridge circuit similar as explained above with regard to FIG. 3. The integration of a step-up level-shifter $T_0$ in an area of a source-down integrated semiconductor device is explained in detail below with regard to FIGS. 7A and 7B. When two level shifters $T_1$, $T_0$ are integrated together with a power-MOSFET, the common metallization 21 typically also extends into the third area. For example, the common metallization 21 may completely be arranged on the second surface 102 of the integrated semiconductor device 100.

Figure 6A:
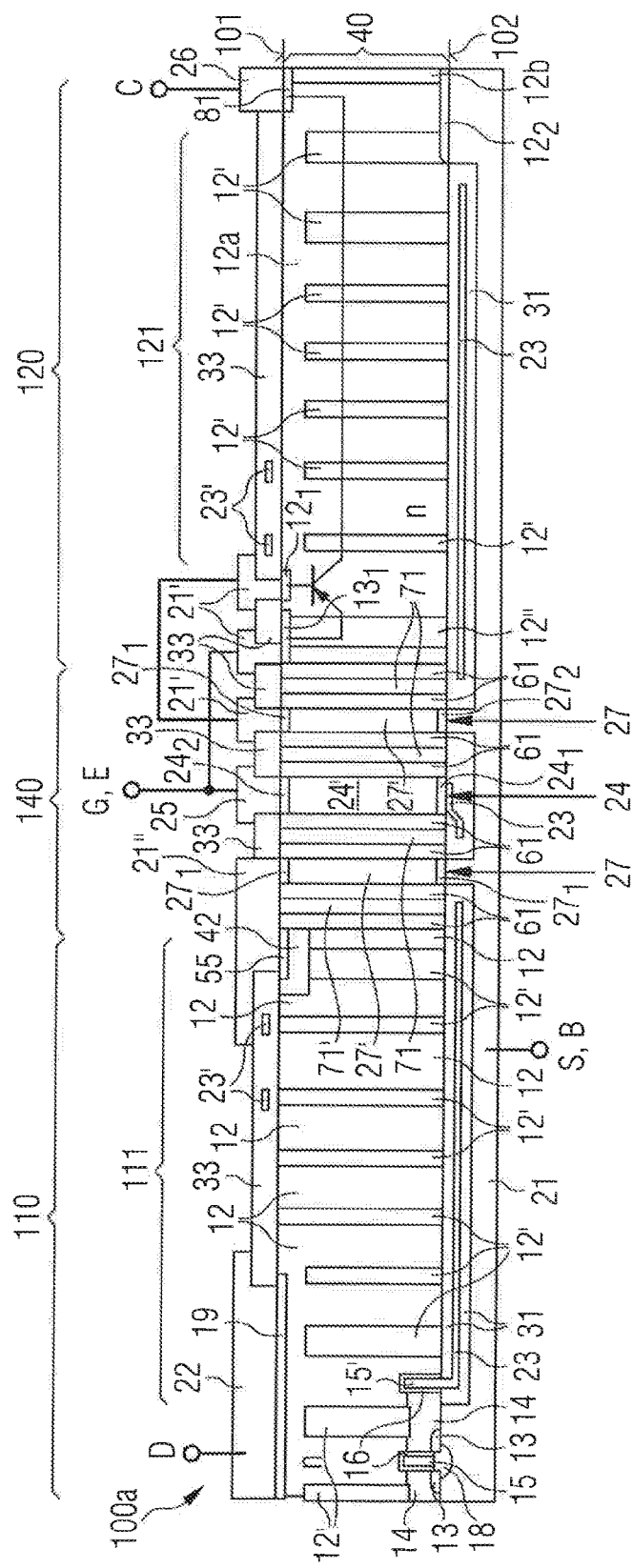
FIG. 6A illustrates a vertical cross-section through an integrated semiconductor device according to an embodiment.

FIG. 6A illustrates a vertical cross-section through an integrated semiconductor device 100a. The integrated semiconductor device 100a is similar to the integrated semiconductor device 100 explained above with regard to FIG. 5 and may also be used as an integrated semiconductor device with a high-side switch and one or two level-shifters in the bridge circuits explained above with regard to FIGS. 1 to 4. In addition, compensation regions 12', 12b of the second conductivity type are provided in the common drift region 12 and the base region 12a to improve on-resistance and/or blocking capability of the power MOSFET and the level-shifter, respectively. In other embodiments, the compensation regions 12', 12b are provided only in one of the first area 110 and the second area 120. The doping concentration of the compensation regions 12', 12b may correspond to the doping concentration of the drift region 12 and the base region 12a, respectively, or may be higher or lower than the doping concentration of the drift region 12 and the base region 12a, respectively.

FIG. 6B illustrates another vertical cross-section through the integrated semiconductor device 100a. Accordingly, the gate conductor 23 and the connection metallization 21' form respective contiguous regions when seen from above. This typically also applies for the gate metallization 25 also having two separated portions in the vertical cross-section of FIG. 6A.

FIG. 7A illustrates a vertical cross-section through an integrated semiconductor device 200. The integrated semiconductor device 200 is similar to the integrated semiconductor device 100 explained above with regard to FIG. 5. The first area 110 of the integrated semiconductor device 200 also includes a power MOSFET in source-down configuration and the through contact area 140 of the integrated semiconductor device 200 also includes a gate via 24 and a first conductive via 27. However, the second area 120 of the integrated semiconductor device 200 includes a step-up level-shifter $T_0$. Accordingly, the semiconductor device 200 may be used as integrated semiconductor device with a low-side switch and one or two or even more level-shifters in the bridge circuits explained above with regard to FIGS. 1 to 4.

In the exemplary embodiment, the step-up level-shifter $T_0$ is implemented as an npn-transistor having an n-type emitter region $12_2$, which extends to the second surface 102 and is in low resistive electric contact with the common metallization 21 also forming a common source and emitter terminal S, E, a p-type base region 14', which is arranged next to the second surface 102, and an n-type collector region 12a, which is typically connected to the collector metallization 26 via an n-type contact region 81' having a higher doping concentration than the collector region 12a.

In the through contact area 140, a second conductive via 29 is arranged to contact a control electrode 23" of the step-up level-shifter $T_0$. The second conductive via 29 may be formed of and/or include a metal, a doped polycrystalline or a monocrystalline semiconductor material 29', for example a mesa region 29' of the first conductivity type (n-type). Optional contact regions $29_1$, $29_2$ of the same doping type as the monocrystalline semiconductor material 29' but more highly doped connect the monocrystalline semiconductor material 29' with the common metallization 21 and a base metallization 25' forming a control metallization of the step-up level-shifter $T_0$, respectively. The base metallization 25' is arranged on the first surface 101 and typically also provides a base terminal B of the step-up level-shifter $T_0$.

FIG. 7B illustrates a vertical cross-section through an integrated semiconductor device 200a. The integrated semiconductor device 200a is similar to the integrated semiconductor device 200 explained above with regard to FIG. 7a and may be used as an integrated semiconductor device with a low-side switch and one or two level-shifters in the bridge circuits explained above with regard to FIGS. 1 to 4. However, the step-up level-shifter $T_0$ of the integrated semiconductor device 200a is implemented as an n-channel MOSFET in the second area 120.

In the exemplary embodiment, an n-type source region $12_2$ of the step-up level-shifter $T_0$ extends to the second surface 102 and is in low resistive electric contact with the common metallization 21 also forming a common source S, S' for the power MOSFET in the first area 110 and the MOSFET in the second area 120. A p-type body region 14' forms respective pn-junctions with the n-type source region $12_2$ and the n-type drift region 12a, which is typically connected to the drain metallization 26 arranged on the first surface 101 via an n-type drain region 81' having a higher doping concentration than the drift region 12a.

In the exemplary embodiment, control electrode 23" forms a gate electrode of an n-channel MOSFET forming the step-up level-shifter $T_0$. In another embodiment, the control electrode 23" is implemented as a trench gate electrode.

In addition, the second conductive via 29 provides a through contact between a gate electrode 23" of the step-up level-shifter $T_0$ and a gate metallization 25' which is arranged on the first surface 101 and typically also provides a gate terminal G' of the step-up level-shifter $T_0$.

Figure 8A:
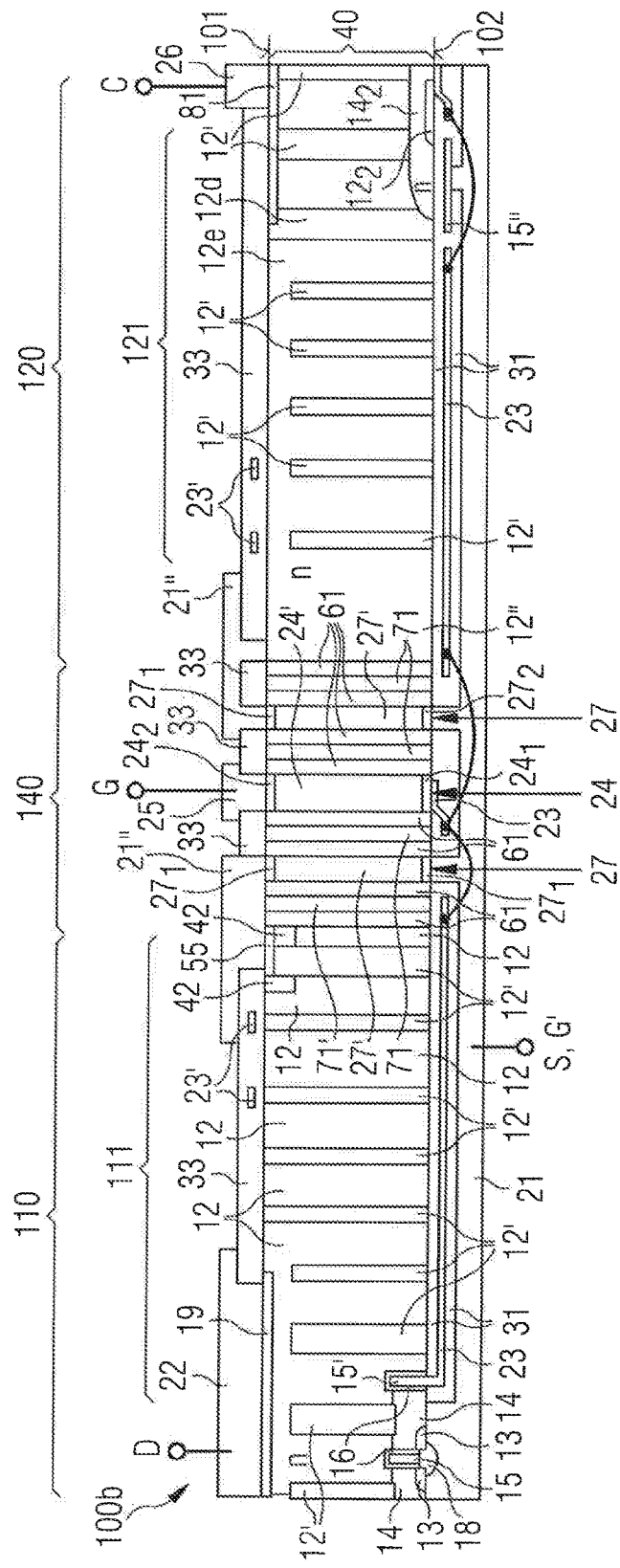
FIG. 8A illustrates a vertical cross-section through an integrated semiconductor device according to still another embodiment.

FIG. 8A illustrates a vertical cross-section through an integrated semiconductor device 100b. The integrated semiconductor device 100b is similar to the integrated semiconductor device 100a explained above with regard to FIGS. 7a, 7b and may be used as an integrated semiconductor device with a high-side switch and one or two level-shifters in the bridge circuits explained above with regard to FIGS. 1 to 4. However, the active area 120 of the integrated semiconductor device 100b includes a p-channel MOSFET as a step-down level-shifter $T_1$.

In the exemplary embodiment, the step-down level-shifter $T_1$ includes a p-type source region $12_2$, which is contacted to the gate metallization 25 and the gate terminal G, respectively, of the power MOSFET in the first area 110 via a gate conductor 23 and a gate via 24. An n-type body region $14_2$, which is also electrically connected with the gate terminal G, forms respective pn-junctions with the source region $12_2$ and a p-type drift region 12*d*, which is electrically connected with a drain metallization 26 and drain terminal D', respectively, via a higher doped p-type drain contact region 81. The drift region 12*d* is embedded in an n-type semiconductor layer 12*e* including further p-type compensation regions 12'. The drain metallization 26 is arranged on the first surface 101. An insulated gate electrode 15" is arranged next to the second surface 102, for example on the second surface 102 as illustrated in FIG. 8A.

FIG. 8B illustrates a vertical cross-section through an integrated semiconductor device 100*c*. The integrated semiconductor device 100*c* also includes an n-channel power MOSFET in the first area 110, however in drain-down configuration. Accordingly, the common metallization 21 arranged on the second surface 102 and also typically arranged in the second area 120 and the through contact area 140, which is typically arranged between the first area 110 and the second area 120, forms a drain metallization also providing a drain terminal D of the power MOSFET. The gate metallization 25 and gate terminal G, respectively, as well as the source metallization 22 and the source terminal S, respectively, of the power MOSFET are arranged on the first surface 101.

According to an embodiment, a step-up level-shifter is formed in the second area 120. In the exemplary embodiment, the step-up level-shifter is implemented as n-channel MOSFET with a source metallization 26', a gate metallization 25' and a drain metallization 21' which are all arranged on the first surface 101 and also provide respective terminals S', G', D'. The source metallization 26' is in low resistive electric contact with an n-type source region 81' and a p-type body region 14' arranged next to the first surface 101. The drain metallization 21' is in low resistive electric contact with an n-type drift region 12*a*. The gate metallization 25' is in low resistive electric contact with a gate electrode 23" insulated from the semiconductor body 40. The gate electrode 23" may be implemented as planar or trench gate electrode.

The semiconductor device 100*c* may be used as integrated semiconductor device with a high-side switch and a step-up level shifter in bridge circuits as explained above with regard to FIGS. 1 to 4.

The integrated semiconductor device explained above with regard to FIG. 5 to FIG. 8B have in common that they include a first area 110 with a vertical power field-effect transistor structure, for example a vertical n-channel power MOSFET structure, a through contact area 140 and at least a further area 120 with a step-down level-shifter $T_1$ or a step-down level-shifter $T_0$, for example two further areas one of which includes step-down level-shifter $T_1$ whereas the other one includes a step-up level-shifter $T_0$.

One or more through contact areas 140 and or at least one of the first and or second conductive vias 27, 29, which are defined by dielectric regions 61 extending between the first surface 101 and the opposite surface 102, may completely surround the first area 110 and/or the further area 120 when seen from above. Accordingly, the first area 110 and the further area 120 are laterally completely insulated by at least one dielectric region 61 from each other. Alternatively, the through contact area 140 including the dielectric region(s) 61 may be substantially bar-shaped, extend between two edges of the semiconductor body and be arranged between the first area 110 and the second area 120 when seen from above. In other words, the dielectric region(s) 61 may be arranged between the first area 110 and the second area 120 in each vertical cross-section comprising the first area 110 and the second area 120. In these embodiments, parasitic devices between the first area 110 and the further area 120 may be avoided and thus the device performance be improved. Typically, a common metallization 21 also forming a load terminal of the power MOSFET is arranged on the opposite surface 102 in the first area 110, the through contact area 140 and the one or more further areas 120.

A terminal of the power MOSFET structure may—on chip level—be electrically connected with one of the three-terminal step-down level-shifter $T_1$ and the three-terminal step-up level-shifter $T_0$.

For example, the first and or second conductive vias 27, 29 of the through contact area 140 may be used to for internal wiring.

In source-down configuration, a gate through contact 24 of the through contact area 140 is typically used to contact a gate electrode of the power MOSFET structure.

In addition, one or more edge termination structures are typically used between the first region 110 and the through contact region 140 and/or between the through contact region 140 and a further region 120 and/or next to an edge of the integrated semiconductor device. The edge termination structures may be formed on the first surface 101 or the second surface 102.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated semiconductor device, comprising:
a semiconductor body comprising a first surface having a normal direction defining a vertical direction, an opposite surface, a first area comprising a vertical power field-effect transistor structure, a second area comprising a three-terminal step-down level-shifter, and a third area comprising a three-terminal step-up level-shifter, wherein a terminal of the vertical power field-effect transistor structure is electrically connected with one of the three-terminal step-down level-shifter and the three-terminal step-up level-shifter, and wherein the vertical power field-effect transistor structure, the three-terminal step-down level-shifter, and the three-terminal step-up level-shifter are disposed within the semiconductor body.

2. The integrated semiconductor device of claim 1, wherein the terminal of the vertical power field-effect transistor structure is formed by a common metallization arranged on the opposite surface at least in the first area and one of the second area and the third area.

3. The integrated semiconductor device of claim 2, further comprising a through contact area comprising a first conductive via extending in a vertical direction through the semiconductor body and electrically connected to the common metallization.

4. The integrated semiconductor device of claim 3, wherein the vertical power field-effect transistor structure comprises a gate electrode arranged next to the opposite surface, the integrated semiconductor device further comprising, in the through contact area, a second conductive via extending in the vertical direction through the semiconductor body and electrically connected to the gate electrode, and a gate metallization arranged on the first surface and electrically connected with the second conductive via.

5. The integrated semiconductor device of claim 3, wherein the step-up level-shifter comprises a control electrode arranged next to the opposite surface, the integrated semiconductor device further comprising at least one of a control terminal arranged on the first surface and electrically connected with the control electrode, and a third conductive via extending, in the vertical direction and in the through contact area, through the semiconductor body and electrically connected to the control terminal.

6. The integrated semiconductor device of claim 2, wherein the vertical power field-effect transistor structure comprises a source region of a first conductivity type arranged next to the opposite surface and electrically connected to the common metallization forming a source terminal of the vertical power field-effect transistor structure, and wherein the three-terminal step-down level-shifter comprises one of a base region of the first conductivity type arranged next to the first surface and electrically connected to the source terminal and a gate electrode electrically connected to the source terminal and arranged next to the opposite surface.

7. The integrated semiconductor device of claim 2, wherein the vertical power field-effect transistor structure comprises a source region of a first conductivity type arranged next to the opposite surface and electrically connected to the common metallization forming a source terminal of the vertical power field-effect transistor structure, and wherein the three-terminal step-up level-shifter comprises one of a source region of the first conductivity type arranged next to the opposite surface and electrically connected to the source terminal and a emitter region of the first conductivity type electrically connected to the source terminal and arranged next to the opposite surface.

8. The integrated semiconductor device of claim 3, wherein the through contact area comprises a dielectric region extending between the first surface and the opposite surface, and wherein the dielectric region is arranged between the first area and the second area in each vertical cross-section comprising the first area and the second area.

9. An integrated semiconductor device, comprising:
a semiconductor body comprising a first surface having a normal direction defining a vertical direction, and an opposite surface;
in a planar view, the integrated semiconductor device further comprising:
a first area comprising a second metallization arranged on the first surface and forming a second load terminal;
a second area comprising a level shifter comprising at least one first metallization arranged on the first surface; and
a through contact area;
in a vertical cross-section, the integrated semiconductor device further comprising:
a common metallization arranged on the opposite surface in the first area, in the at least one second area and the through contact area, and forming a first load terminal;
a first dielectric region extending between the first surface and the opposite surface;
a second dielectric region extending between the first surface and the opposite surface;
a conductive structure electrically connected with the first load terminal, extending to the first surface, and arranged in the through contact area and between the first dielectric region and the second dielectric region;
a gate terminal arranged on the first surface; and
a gate electrode for controlling a load current between the first load terminal and the second load terminal, the gate electrode being arranged in the first area and electrically connected with gate terminal.

10. The integrated semiconductor device of claim 9, wherein the gate electrode is arranged next to the opposite surface, the integrated semiconductor device further comprising a gate through contact in the through contact area electrically connected with the gate terminal and the gate electrode.

11. The integrated semiconductor device of claim 9, further comprising in the first area a source region of a first conductivity type electrically connected with the first load terminal, a drift region of the first conductivity type electrically connected with the second load terminal, and a body region of a second conductivity type arranged between the source region and the drift region.

12. The integrated semiconductor device of claim 9, wherein the level shifter further comprises one of an insulated gate electrode and a bipolar transistor structure.

13. The integrated semiconductor device of claim 12, wherein the insulated gate electrode is electrically connected to the first load terminal.

14. The integrated semiconductor device of claim 12, wherein the bipolar transistor structure comprises an emitter region electrically connected to the first load terminal.

* * * * *

UNITED STATES PATENT AND TRADEMARK OFFICE
CERTIFICATE OF CORRECTION

PATENT NO. : 9,960,156 B2  
APPLICATION NO. : 14/795207  
DATED : May 1, 2018  
INVENTOR(S) : F. Hirler et al.

Page 1 of 1

It is certified that error appears in the above-identified patent and that said Letters Patent is hereby corrected as shown below:

In the Claims

Column 20, Line 37 (Claim 9, Line 30) please change "with gate" to -- with the gate --

Signed and Sealed this  
Tenth Day of July, 2018

Andrei Iancu  
*Director of the United States Patent and Trademark Office*